(12) United States Patent
Staszewski et al.

(10) Patent No.: US 6,734,741 B2
(45) Date of Patent: May 11, 2004

(54) FREQUENCY SYNTHESIZER WITH DIGITALLY-CONTROLLED OSCILLATOR

(75) Inventors: Robert B. Staszewski, Garland, TX (US); Dirk Leipold, Plano, TX (US); Khurram Muhammad, Richardson, TX (US); Chih-Ming Hung, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/006,607

(22) Filed: Nov. 30, 2001

(65) Prior Publication Data

US 2002/0158696 A1 Oct. 31, 2002

Related U.S. Application Data

(60) Provisional application No. 60/313,749, filed on Aug. 20, 2001, and provisional application No. 60/286,572, filed on Apr. 25, 2001.

(51) Int. Cl.$^7$ .................................................. H03L 7/00
(52) U.S. Cl. .................. 331/36 C; 331/117 R; 375/376
(58) Field of Search ................. 331/36 C, 100, 331/117 R, 117 FE, 177 V; 375/376; 327/156

(56) References Cited

U.S. PATENT DOCUMENTS

| | | | | |
|---|---|---|---|---|
| 4,965,531 A | * | 10/1990 | Riley | 331/1 A |
| 5,446,420 A | * | 8/1995 | Westwick | 331/179 |
| 6,028,488 A | * | 2/2000 | Landman et al. | 331/1 A |
| 6,094,105 A | * | 7/2000 | Williamson | 331/116 FE |

OTHER PUBLICATIONS

Radke, A 14–Bit Current–Mode Sigma–Delta DAC Based Upon Rotated Data Weighting, IEEE Journeal of Solid–State Circuits, vol. 35, No. 8, Aug. 2000, US.

* cited by examiner

Primary Examiner—Robert Pascal
Assistant Examiner—Joseph Chang
(74) Attorney, Agent, or Firm—Ronald O. Neerings; Wade James Brady, III; Frederick J. Telecky, Jr.

(57) ABSTRACT

A transmitter (10) based on a frequency synthesizer includes an LC tank (12) of a digitally controlled oscillator (DCO) with various arrays of capacitors. The LC tank 12 is divided into two major groups that reflect two general operational modes: acquisition and tracking. The first group (process/voltage/temperature and acquisition) approximately sets the desired center frequency of oscillation initially, while the second group (integer and fractional tracking) precisely controls the oscillating frequency during the actual operation. For highly accurate outputs, dynamic element matching (DEM) is used in the integer tracking controller to reduce non-linearities caused by non-uniform capacitor values. Also, a preferred range of the integer tracking capacitor array may be used for modulation after the selected channel has been acquired. A digital sigma-delta modulator circuit (50) drives a capacitor array (14d) in response to the fractional bits of the error word. On mode switches, the accumulated error is recalculated to a phase restart value to prevent perturbations.

28 Claims, 10 Drawing Sheets

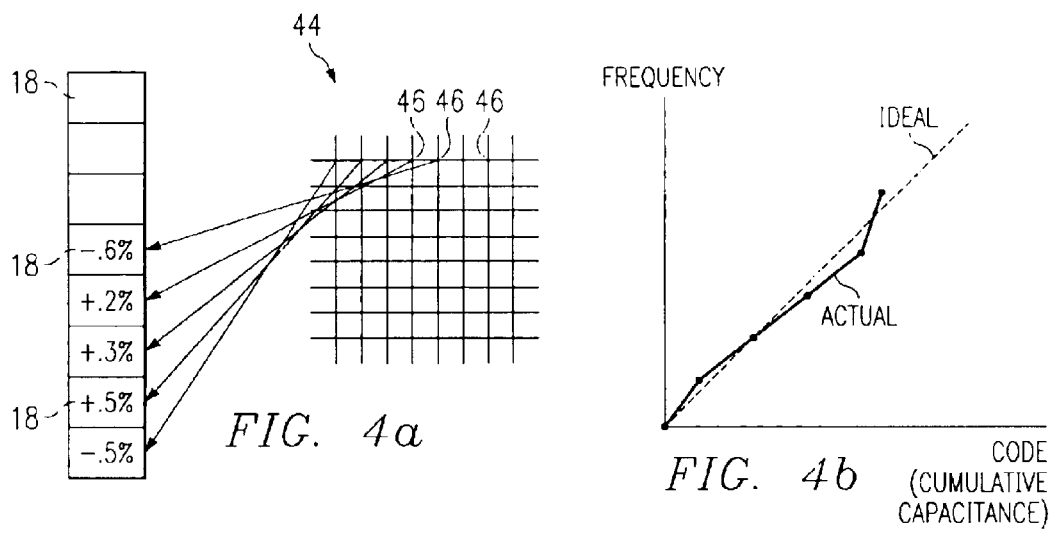
FIG. 4a
FIG. 4b
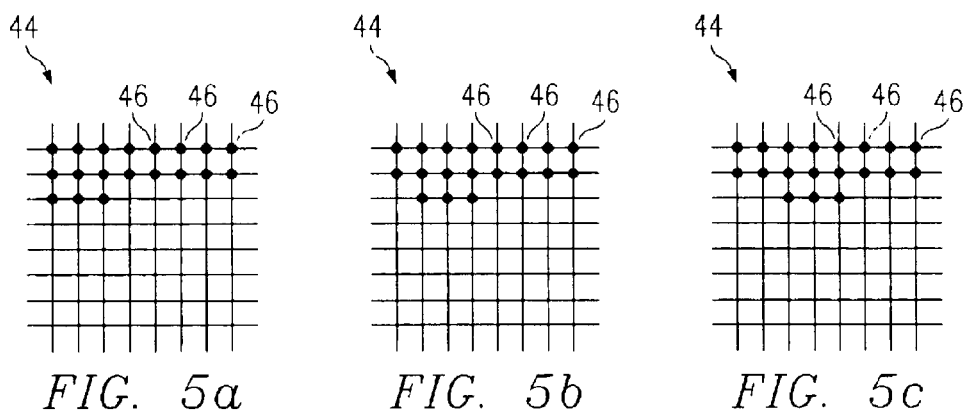
FIG. 5a  FIG. 5b  FIG. 5c
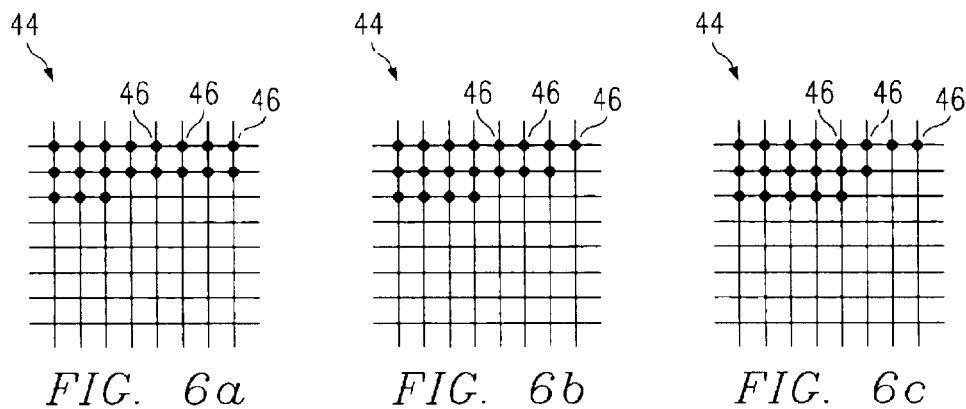
FIG. 6a  FIG. 6b  FIG. 6c

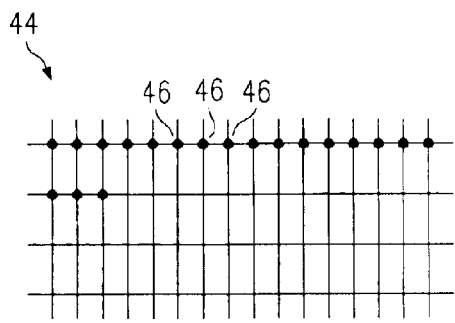 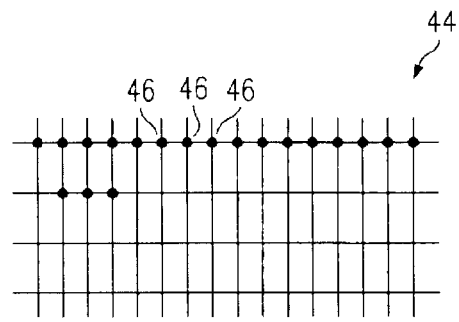
FIG. 7a    FIG. 7b
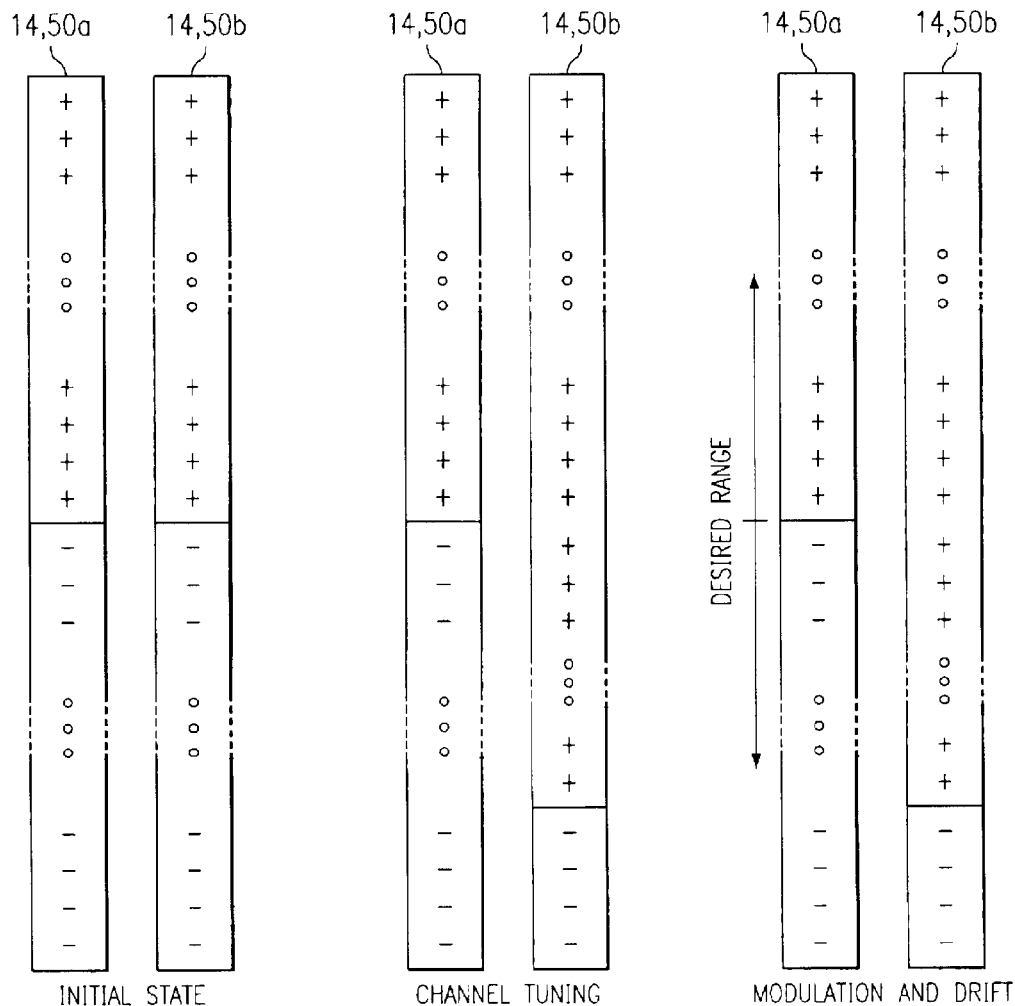
FIG. 9a    FIG. 9b    FIG. 9c

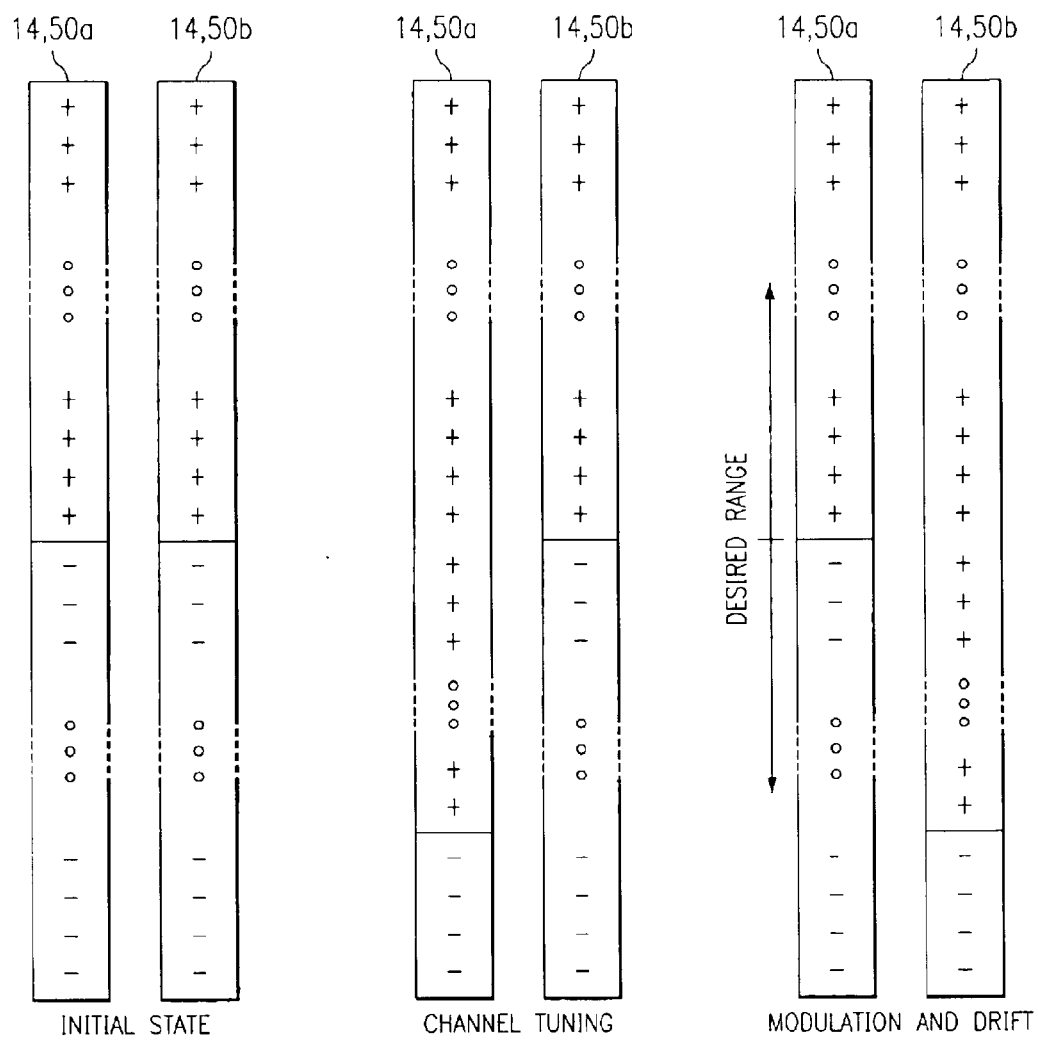
FIG. 10a  INITIAL STATE
FIG. 10b  CHANNEL TUNING
FIG. 10c  MODULATION AND DRIFT
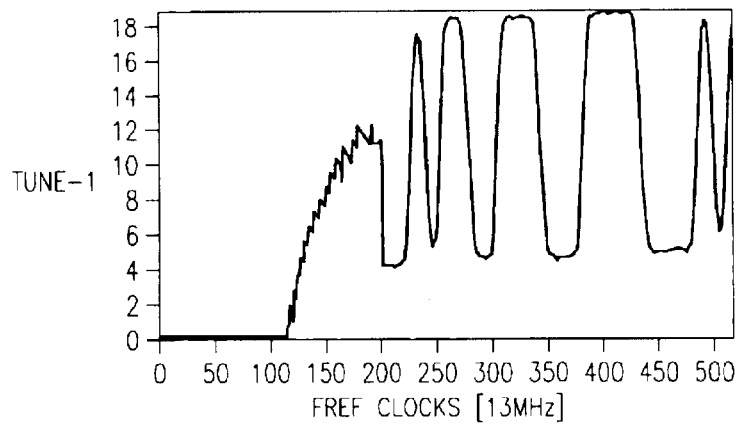
FIG. 11a

US 6,734,741 B2

FREQUENCY SYNTHESIZER WITH DIGITALLY-CONTROLLED OSCILLATOR

CROSS-REFERENCE TO RELATED APPLICATIONS

This application claims the benefit of the filing date of copending provisional applications U.S. Ser. No. 60/286,572, filed Apr. 25, 2001, entitled "Frequency Synthesizer Architecture of the Digital Radio Processor (v2.0)" to Staszewski et al and U.S. Ser. No. 60/313,749, filed Aug. 20, 2001, entitled "Power Saving Circuitry Using Predictive Logic" to Staszewski et al.

STATEMENT OF FEDERALLY SPONSORED RESEARCH OR DEVELOPMENT

Not Applicable

BACKGROUND OF THE INVENTION

1. Technical Field

This invention relates in general to communications circuits and, more particularly, to frequency synthesizers and PLL loops with digitally controlled oscillators.

2. Description of the Related Art

A great reduction of the transistor features in recently developed deep-submicron CMOS processes shifts the design paradigm towards more digitally-intensive techniques. In a monolithic implementation, the manufacturing cost of a design is measured not in terms of a number of devices used but rather in terms of the occupied silicon area, no matter what the actual circuit complexity.

Analog and RF (radio frequency) circuits used in communication circuits, however, are not easily implemented in a deep-submicron CMOS process. For example, in Texas Instruments'CMOS process (C035) of 0.08 $\mu$m L-effective features a digital gate density of 150K equivalent (2-input NAND) gates per $mm^2$. An average-size inductor for an integrated LC oscillator occupies about 0.5 $mm^2$ of silicon area. A low-noise charge pump, or a low-distortion image-reject modulator, both good examples of classical RF transceiver components, occupy roughly about the same area, which could be traded for tens of thousands of digital gates.

Migrating to a digitally-intensive synthesizer architecture brings forth the following well-known advantages: (1) fast design turn-around cycle using automated CAD tools (VHDL or Verilog hardware-level description language, synthesis, auto-place and auto-route with timing-driven algorithms, parasitic backannotation and postlayout optimization), (2) much lower parameter variability than with analog circuits, (3) ease of testability, (4) lower silicon area and dissipated power that gets better with each CMOS technology advancement (also called a "process node") and (5) excellent chances of first-time silicon success. Commercial analog circuits usually require several design iterations to meet marketing requirements.

There is a wide array of opportunities that integration presents. The most straightforward way would be to merge various digital sections into a single silicon die, such as DRAM or Flash memory embedded into DSP or controller. More difficult would be integrating the analog baseband with the digital baseband. Care must be taken here to avoid coupling of digital noise into the high-precision analog section. In addition, the low amount of voltage headroom challenges one to find new circuit and architecture solutions. Integrating the analog baseband into RF transceiver section presents a different set of challenges: The conventional Bi-CMOS RF process is tuned for high-speed operation with a number of available passive components and does not fundamentally stress high precision.

Sensible integration of diverse sections results in a number of advantages: (1) lower total silicon area. In a deep-submicron CMOS design, the silicon area is often bond-pad limited; consequently, it is beneficial to merge various functions on a single silicon die to maximize the core to bond-pad ratio, (2) lower component count and thus lower packaging cost, (3) power reduction—no need to drive large external inter-chip connections and (4) lower printed-circuit board (PCB) area, thus saving the precious "real estate."

Deep-submicron CMOS processes present new integration opportunities on one hand, but make it extremely difficult to implement traditional analog circuits, on the other. A digitally controlled oscillator (DCO) is very desirable, but it is important that the DCO be able to accurately track channels and modulate signals on a par with analog voltage controlled oscillators.

Therefore, a need has arisen for a method and apparatus for a high performance digitally controlled oscillator.

BRIEF SUMMARY OF THE INVENTION

In a first aspect of the present invention, a frequency synthesizer comprises a digitally controlled oscillator, including a plurality of switched capacitors, and control circuitry for selectively enabling and disabling the capacitors responsive to an oscillator tuning word. The control circuitry includes select circuitry for enabling a number of capacitors responsive to the oscillator tuning word and circuitry for dynamically varying which capacitors are enabled for a given oscillator tuning word to reduce non-linearities caused by slight variances in capacitive values.

This aspect of the invention provides the advantage that non-linearities due to slight variations in capacitive values in the digitally controlled oscillator are smoothed out over time.

In a second aspect of the present invention, a frequency synthesizer comprises a digitally controlled oscillator, including a plurality of switched capacitors, and control circuitry for selectively enabling and disabling the capacitors. The control circuitry includes circuitry for tuning the digitally controlled oscillator to a selected frequency by enabling and disabling capacitors in a first set and circuitry for modulating the digitally controlled oscillator by enabling and disabling capacitors mainly in a second set.

This aspect of the invention provides the advantage that a preferred range of capacitors can be used for modulation and drift corrections.

In a third aspect of the present invention, a frequency synthesizer comprises a digitally controlled oscillator, including a first set of switched capacitors and a second set of switched capacitors, where the second set of switched capacitors are in a physically separate area from the first set of switched capacitors, and control circuitry for selectively enabling and disabling the capacitors responsive to an oscillator tuning word. The control circuitry comprises first tracking circuitry for enabling and disabling capacitors responsive to an first portion of the oscillator tuning word and a first clock and second tracking circuitry for enabling and disabling capacitors responsive to a second portion of the oscillator tuning word and a second clock, wherein the second clock is significantly faster than the first clock.

This aspect of the invention provides the advantage that corrections associated with a rapidly changing part of a correction signal can be made with a physically separate set of capacitors, without contaminating the capacitors used for corrections responsive to a slower changing portion of the error signal.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIGS. 4a and 4b illustrate variation in capacitive values in the tracking capacitor array and non-linearities caused in the output caused thereby;

FIGS. 5a, 5b and 5c illustrate a first method of operation for the column select and DEM circuitry of the tracking oscillator controller;

FIGS. 6a, 6b and 6c illustrate a second method of operation for the column select and DEM circuitry of the tracking oscillator controller;

FIGS. 7a and 7b illustrate a different configuration for the switch matrix in conjunction with column select and DEM circuitry of the tracking oscillator controller;

FIGS. 9a, 9b and 9c illustrate a first method of improving the quality of the output by using a desired range of capacitors in the tracking array;

FIGS. 10a, 10b and 10c illustrate a second method of improving the quality of the output by using a desired range of capacitors in the tracking array;

FIGS. 11a and 11b illustrate the use of sigma-delta modulation of the fractional tracking bits;

DETAILED DESCRIPTION OF THE INVENTION

The present invention is best understood in relation to FIGS. 1–15 of the drawings, like numerals being used for like elements of the various drawings.

Figure 1:
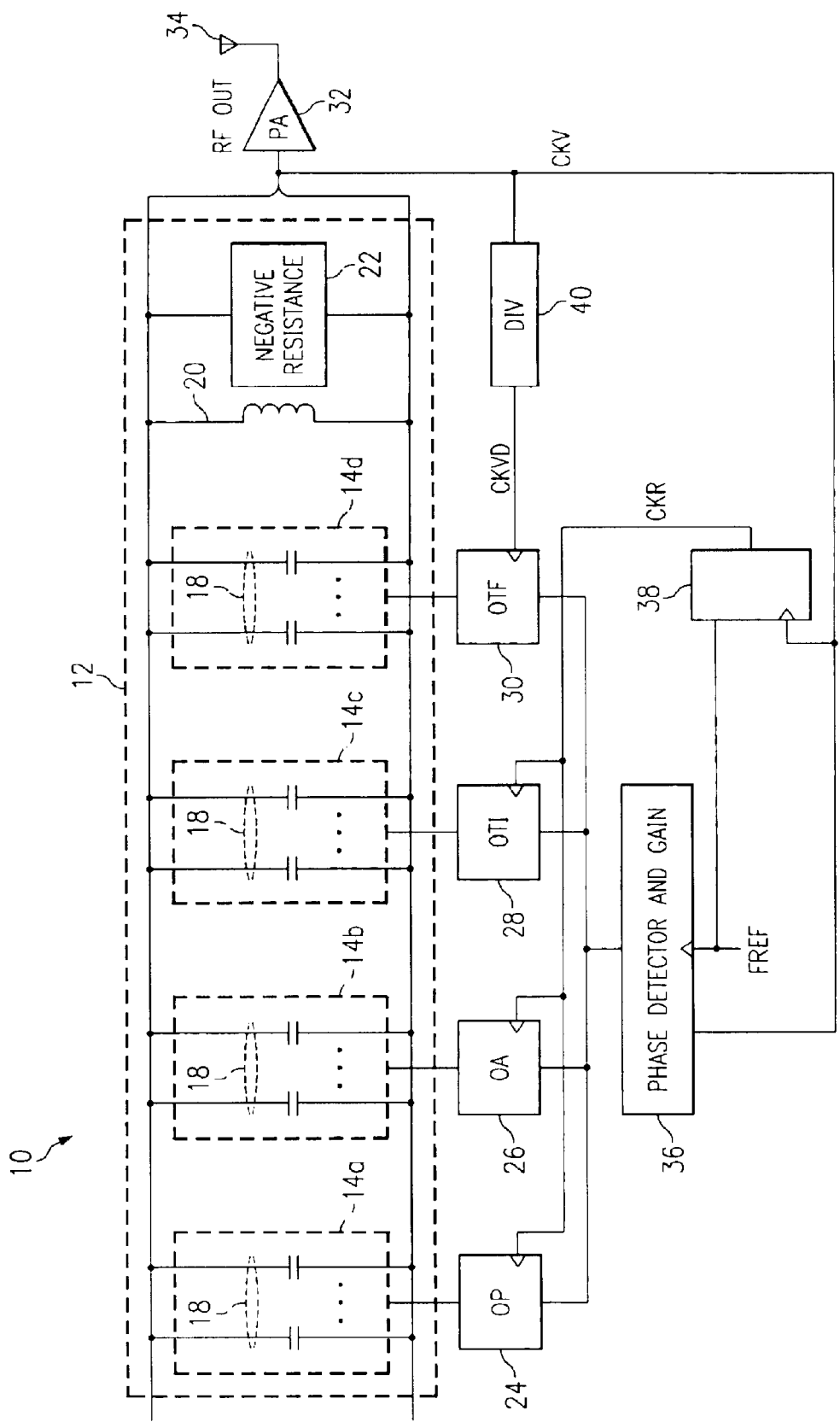
FIG. 1 illustrates a block diagram of RF transmitter circuit that is based on a frequency synthesizer with a direct frequency/phase modulation capability.

FIG. 1 illustrates a block diagram of RF transmitter circuit 10 that is based on a frequency synthesizer capable of directly modulating phase/frequency of oscillation. The RF transmitter circuit 10 includes an LC tank 12 having multiple arrays 14a–d of switched capacitors 18 that are implemented as varactors in the preferred embodiment, an inductor 20 and a negative resistance 22 whose purpose is to perpetuate the oscillation. Switched capacitor arrays 14a–d are individually controlled by respective oscillator control circuits. A PVT (Process/Voltage/Temperature) oscillator controller (OP) 24 controls array 14a, acquisition oscillator controller (OA) 26 controls array 14b, integer tracking oscillator controller (OTI) 28 controls array 14c and fractional tracking oscillator controller (OTF) 30 controls array 14d. Each oscillator controller 24–30 can control the oscillation of the transmitter circuit by individually enabling and disabling individual capacitors 18 in its respective array 14a–d. Each capacitor 18 may be switched between high capacitive states and low capacitive states. Whether a capacitor is enabled or disabled depends upon its relative capacitive state. For illustration, it is assumed that a capacitor is "disabled" if it is placed in a low capacitive state and "enabled" if it is placed in a high capacitive state; in other embodiments, a capacitor could be enabled if it is placed in a low capacitive state and enabled if it is placed in a high capacitive state.

The output of the LC tank oscillator 12 is a differential clock signal CKV, which is received by the power amplifier 32. The output of power amplifier 32 is the RF output to the antenna 34. CKV is fed back to phase detector and gain circuit 36. Phase detector and gain circuit 36 also receives a reference frequency, FREF, typically the output of a crystal oscillator, and outputs an error signal to the oscillator controllers 24, 26, 28 and 30. FREF is also received by a flip-flop 38, which is clocked by CKV to produce a retimed reference clock CKR. CKR is used to clock oscillator controllers 24, 26 and 28. A divided CKV clock, CKVD, is produced by divider circuit 40, which could be a divide-by-4 circuit. CKVD clocks the fractional tracking oscillator controller.

The architecture shown in FIG. 1 could be used for a variety of wireless communication applications; for purposes of illustration, specifics will be discussed in view of a Bluetooth implementation. In this implementation, the PVT array 14a uses eight switched capacitors in a binary-weighted arrangement. The PVT array 14a has an incremental change in frequency of $\Delta f=2.316$ MHz. Similarly, the acquisition array 14b uses eight switched capacitors in a binary-weighted arrangement. The acquisition array 14b has an incremental change in frequency of $\Delta f=461$ kHz and a range of 118 MHz. There are two tracking arrays, an integer tracking array 14c and a fractional tracking array 14d. The integer tracking array includes sixty-four unit-weighted capacitors each capable of a $\Delta f=23$ kHz, with a range of 1.472 MHz. The fractional tracking array includes eight unit-weighted capacitors, $\Delta f=23$ kHz; these capacitors are matched to the capacitors of the integer tracking array 14c.

From the operational perspective, the LC tank 12 is divided into two major groups that reflect two general operational modes: acquisition and tracking. The first group approximately sets the desired center frequency of oscillation initially, while the second group precisely controls the oscillating frequency during the actual operation. During acquisition, the frequency range is quite high but the required resolution is relatively low, therefore a binary-weighted structure may be the best arrangement for the capacitor arrays 14a and 14b, although other structures could be used.

The acquisition group of switched capacitors is further divided into two subgroups: environmental and channel select. The environmental subgroup corrects the center oscillating frequency of the operational band due to process-voltage-temperature (PVT) variations and could be performed at manufacturing, on power-up or on "as needed" basis. The channel select capacitor array 14b controls the frequency acquisition process for the desired transmission channel. Both groups are best implemented using individual binary-weighted capacitance structures, but their ranges could be overlapping. There is no need to preserve the binary-weight continuity between the environmental and channel select structures due to the different origin of their respective control inputs. The PVT correction is infrequent and and might be done directly through register interface, whereas the channel select DCO control input is performed dynamically and is an integral part of the synthesizer PLL (phase locked loop).

The tracking-mode operation presents, on the other hand, a different set of requirements. The frequency range is relatively low but the required resolution is quite high. The binary-weighted capacitance arrangement of the tracking mode is a poor choice here, because of binary switching noise, poor device matching of different size devices, and so on. A better structure is an array of unit devices of fine but identical dimensions. Further refinement of the frequency resolution is obtained by performing a high-speed dither of one or few of the tracking bits. It is implemented with a first, second or third order of a $\Sigma\Delta$ modulator of the fractional part of the tracking phase error.

Figure 2:
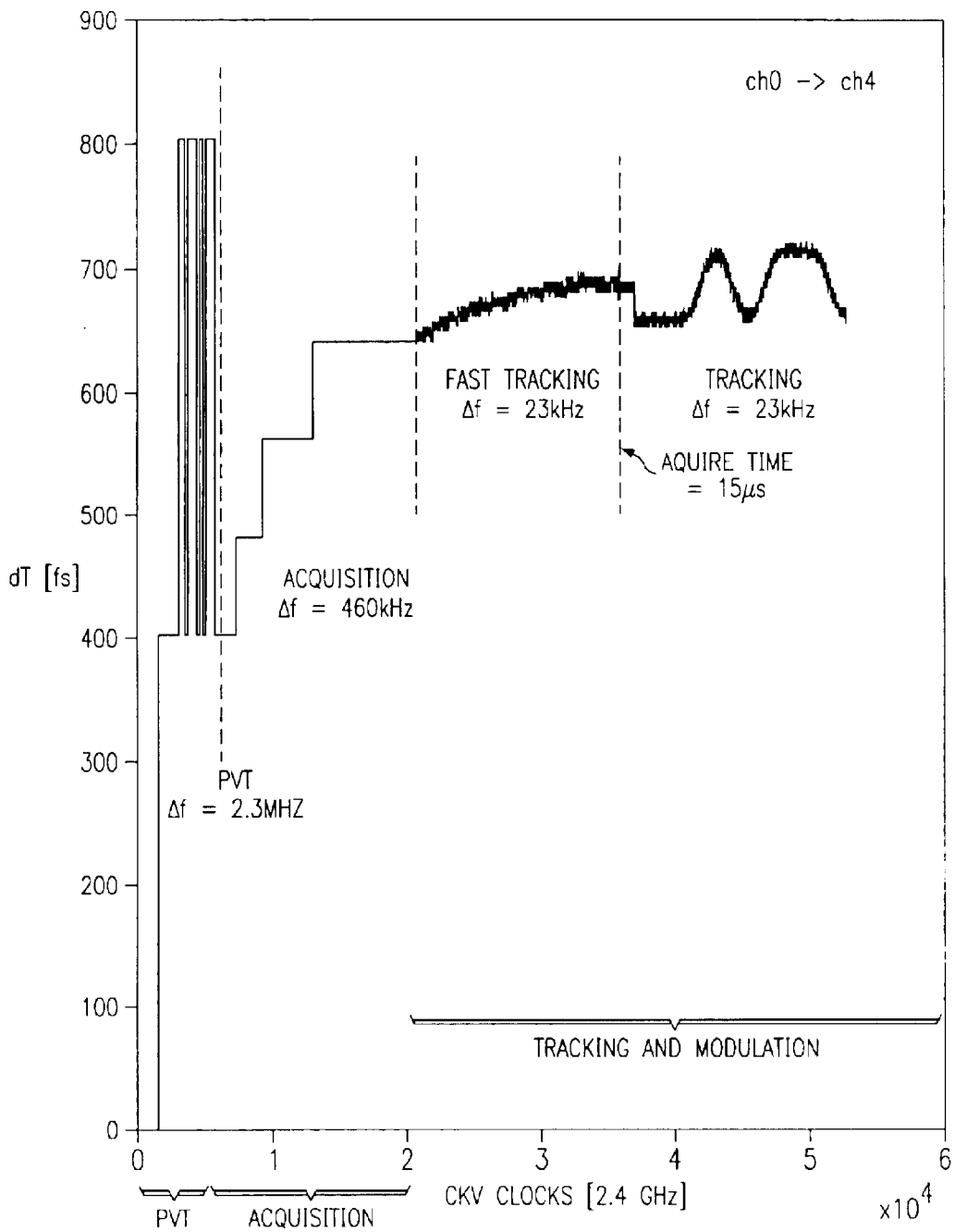
FIG. 2 illustrates operation of the various modes for controlling oscillation of the RF transmitter circuit.

FIG. 2 illustrates operation of the various modes. At a cold power up, the transmitter core 10 enables the PVT oscillator controller 24. This controller makes very coarse (2.315 MHz) adjustments to the frequency. Next, the output of the PVT oscillator controller is put on hold and the acquisition oscillator controller 26 is enabled. The acquisition oscillator controller 26 quickly brings the frequency near the selected channel in 460 kHz steps.

After acquisition of the selected channel is complete, the output of the acquisition oscillator controller 26 is put on hold and the tracking oscillator controllers 28 and 30 are enabled. The finest selection of the requested channel can only be accomplished using the tracking bank varactors with all the resolution enhancement techniques possible for this capacitor bank. The dynamic range of this mode has to cover the frequency resolution grid of the preceding acquisition mode. In this mode, the frequency steps are very fine but the loop bandwidth could be as fast as in the acquisition mode. The tracking oscillator controllers 28 and 30 first fine tune the channel select and then perform the modulation of the output signal RF OUT.

Figure 3:
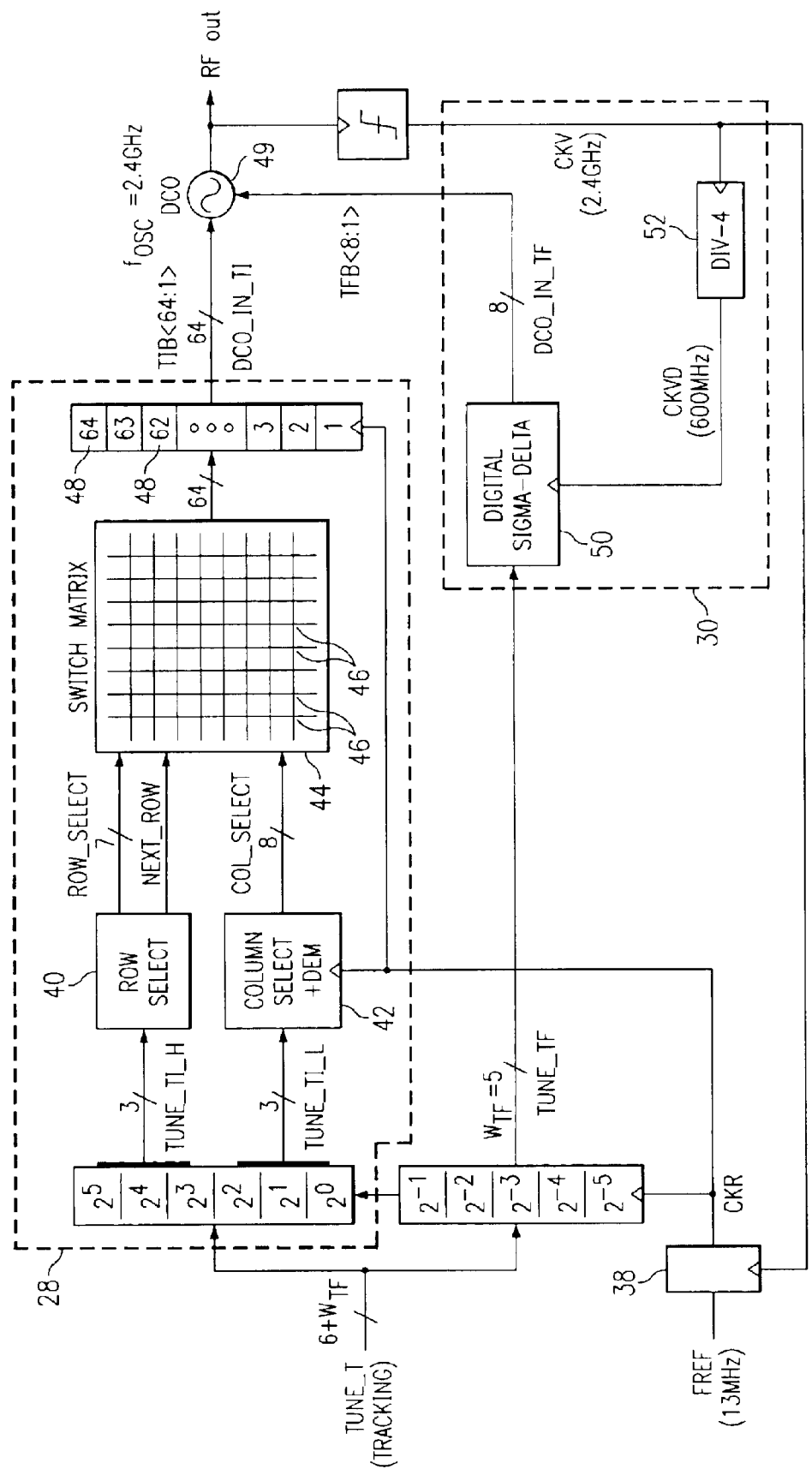
FIG. 3 illustrates a block diagram of a tracking oscillator controller.

FIG. 3 illustrates a block diagram of the tracking oscillator controllers 28 and 30. In the illustrated embodiment, the TUNE_T, the tuning word output from the phase detections and gain circuit 36, has six integer bits and five fractional bits. The integer bits are processed by the integer tracking oscillator controller 28 and the fractional bits are processed by the fractional tracking oscillator controller 30. The integer tracking oscillator controller 28 includes a row select circuit 40 and a column select and DEM (dynamic element matching) circuit 42. The outputs of the row select circuit 40 and a column select and DEM circuit 42 are received by a switch matrix 44. The switch matrix 44 provides sixty-four discrete switches 46 (corresponding to the sixty-four switched capacitors in the integer tracking array 14c) that may be enabled or disabled by the row select circuit 42 and column select and DEM circuit 42 responsive to TUNE_T. The switch matrix is coupled to a bank of sixty-four resampling drivers 48, each individual resampling driver 48 having a respective switch 46 and a respective capacitor 18 in switched capacitor array 14c. The resampling drivers 48 selectively enable or disable capacitors in the integer tracking array 14c in response to the associated switches 46. Using resampling drivers 48 clocked at CKR eliminates timing errors due to path differences. The various capacitor arrays 14a–d of the LC tank 12 are part of the DCO 49.

The row select circuit 40, column select circuit 42 and resampling drivers 48 are clocked by CKR. It should be noted that while the switch matrix is shown in a row/column configuration, an actual implementation may not be a precise grid. Hence, a "row" could be any predefined group of switches in the matrix.

The fractional tracking oscillator controller 30 includes a digital sigma-delta modulator circuit 50 that drives the individual capacitors 18 in the fractional tracking array 14d in response to the fractional bits of the TUNE_T word. The digital sigma-delta circuit is clocked by CKVD, which is assumed, in the illustrated embodiment, to be one-fourth of the 2.4 GHz CKV clock. Accordingly, the fractional tracking oscillator controller 30 is capable of switching capacitors in array 14d at a frequency of 600 MHz, while the integer tracking oscillator controller 28 switches capacitor at a frequency of 13 MHz.

FIGS. 4a–b illustrate a problem that is addressed by the DEM circuitry in the column select and DEM circuit 42. As shown in FIG. 4a, each switch 46 in the switch matrix 44 controls a capacitor 18 in array 14c. Ideally, each of the capacitors 18 in array 14c has the exact same capacitive value. Using real-world process fabrication, however, the capacitive value of each capacitor 18 will vary slightly from the ideal. As capacitors are enabled or disabled by the integer tracking oscillator controller 28, non-linearities will be evident in the output due to the variations in capacitive values, as shown in FIG. 4b.

The operation of the column select and DEM circuitry 42 is shown in FIGS. 5a–c. In this example, the capacitors 18 associated with an unfilled row of the switch matrix 44 are rotated on each CKR clock cycle (or faster). In FIG. 5a, the first three columns of row three are enabled. In FIG. 5b, on the next CKR clock cycle, columns two through four, rather than columns one through three, are enabled. On the next clock cycle, columns three through five are enabled.

Accordingly, on each CKR clock cycle, the set of capacitors used in the array 14c changes slightly. Over time, the non-linearities shown in FIG. 4b average out, thereby producing a much more accurate output.

In FIGS. 5a–c, the enabled switches for a single row are rotated. This can be accomplished, for example, by incrementing (or decrementing) the starting column of the enabled switches on each clock cycle. This method could be varied slightly by including two (or more) rows in the rotation, as shown in FIGS. 6a–c, where the last unfilled row and previous row are rotated.

Another variation is to vary the configuration of the switching matrix 44, to lengthen (or shorten) the number of columns per row. In FIGS. 7a–b, the switch matrix is configured as a 4×16 matrix, rather than the 8×8 matrix shown in FIGS. 5a–c. As before, the enabled switches 46 are rotated on each clock cycle. The larger rows may provide a better output because a greater number of capacitors will be included in the rotation.

Figure 8:
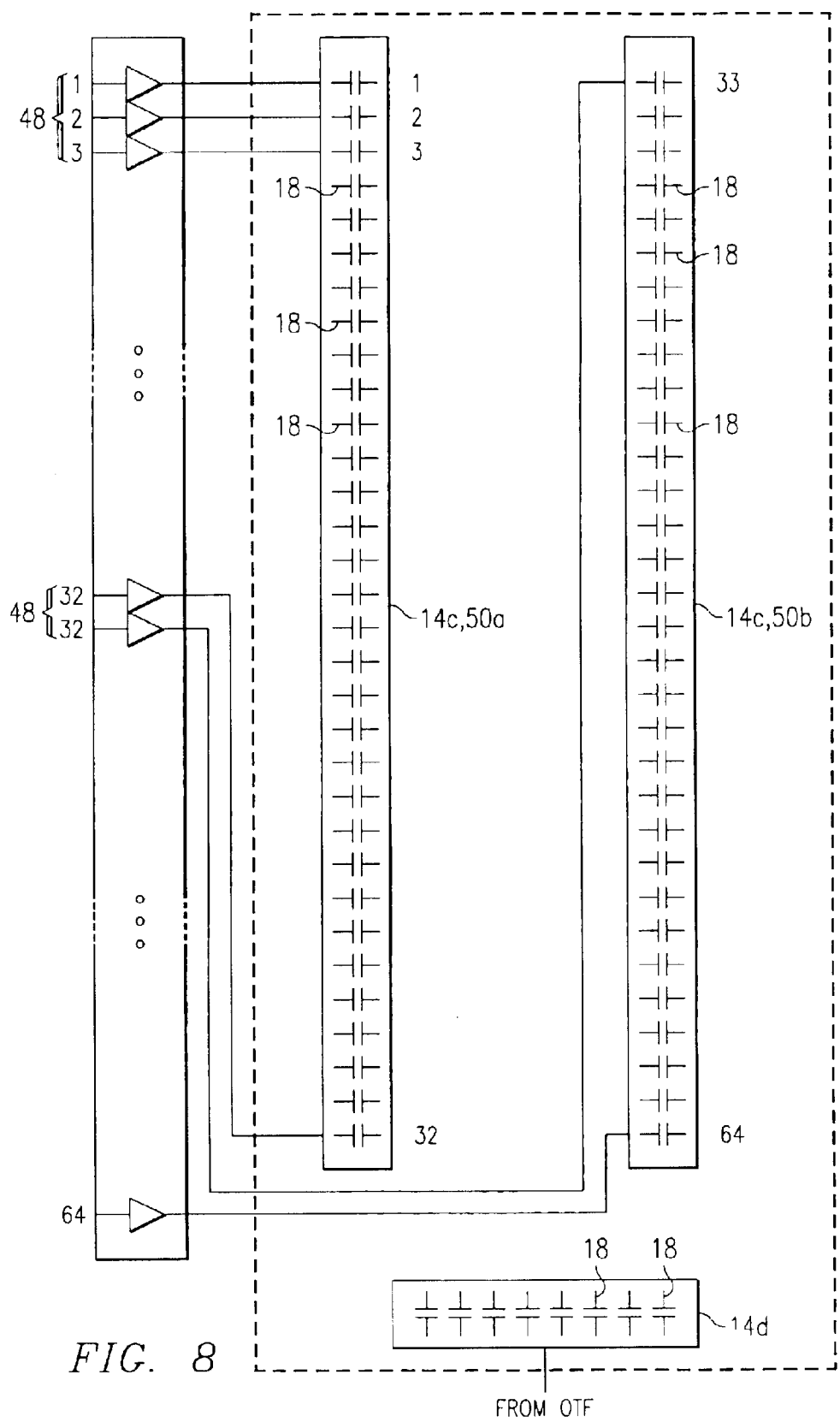
FIG. 8 illustrates a layout diagram for the capacitors of the tracking capacitor arrays.

FIG. 8 illustrates a layout diagram for the capacitors 18 of arrays 14c and 14d. As can be seen in FIG. 8, capacitor array 14c is arranged in two separate columns 50a and 50b, although the capacitors could be arranged in any number of columns depending upon various layout issues. The fractional tracking array 14d is separate from capacitor array 14c.

As is evident in FIG. 8, the capacitors in column 50a are closer to the resampling drivers 48 than are the capacitors in column 50b and can be accessed by a relatively straight path. During modulation, if the signals that turn the capacitors in column 50b on and off take longer than the signals to reach the other capacitors in column 50a, non-linearities and glitches will be introduced into the output signal.

FIGS. 9a–c illustrate a first method of improving the quality of the output. In the initial state, shown in FIG. 9a, half of the capacitors in each column 50a and 50b are turned on (as designated by a "+") and half are turned off (as designated by a "−"). During tracking, the capacitors in the less desirable column 50b are enabled or disabled in order to fine tune the oscillator to the selected channel, to the extent possible. If additional capacitors need to be enabled or disabled, capacitors in column 50a may be used, preferably those capacitors at the edges of the column. After channel tuning, the capacitors in column 50a are used for modulation and drift. In this way, the most desirable capacitors are used for generating the signal once data is being transmitted.

It should be noted that while the preferred center point was shown as the middle of column 50a, the preferred center point could be set at any location in either column. Even for a single column of capacitors, a desirable range of capacitors could be defined and the preferred center point set to the middle of that range. Capacitors outside of the desired range could be used for channel tuning; once channel tuning was completed, the desired range could be used for modulation and drift. The center of the desired range need not be in the center of a column.

FIGS. 10a–c illustrate an alternative embodiment for using the most desirable range for modulation. Starting from the same initial state in FIG. 10a, channel tuning occurs in FIG. 10b without regard for a desired range of capacitors. Once channel tuning is complete, the switch matrix 44 is rearranged, such that the desired range is restored and the capacitors in the less desirable locations are selected for the (already accomplished) channel tracking. Once modulation begins, the capacitors in the desired range are used.

Referring again to FIG. 3, a digital sigma-delta modulator 50 is used to perform a high-speed dither of the fractional tracking bits. The sigma-delta modulator may be implemented using a first, second, or third order sigma-delta modulator. This method trades the sampling rate for the resolution. For example, if the frequency resolution of the 2.4 GHz DCO is $\Delta f(T) = 23$ kHz with a 13 MHz update rate, then the effective time-averaged frequency resolution after a 600 MHz $\Sigma\Delta$ dither with five sub-LSB bits is $\Delta f(T^{-\Sigma\Delta}) = 23$ kHz$/2^5 = 718$ Hz.

The fractional path of the DCO tracking bits, which undergoes high-speed dithering, is entirely separated from the lower-speed integer part. A dedicated DCO input avoids "contaminating" the rest of the tracking bits with frequent transitions. The actual merging of both parts is performed inside the oscillator through time-averaged capacitance summation. Additionally, the fractional tracking bank 14d can be implemented in a small area, where the fabrication may be optimized for the performance of the high-speed tracking. It should be noted that CKVD is synchronous to CKR, which reduces spurs in the RF output.

Figure 11B:
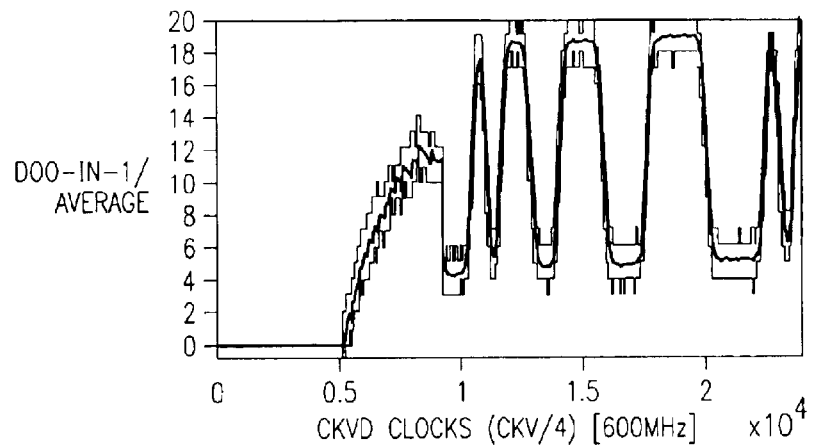

FIG. 11a illustrates a fixed point DCO tuning word operating at FREF (13 MHz). FIG. 11b illustrates DCO input word operating at CKVD, with the black line in the middle being the running average.

Figure 12A:
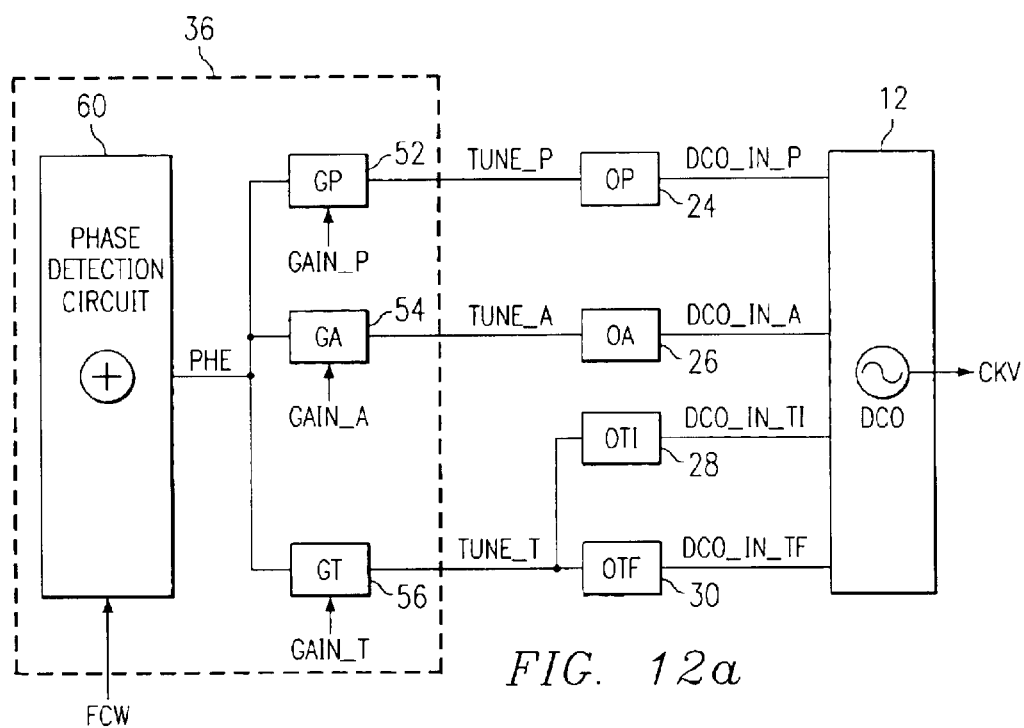
FIG. 12a illustrates a block diagram of the frequency synthesizer showing separate phase detector and gain circuits.

FIG. 12a illustrates a more detailed block diagram of the phase operation portion of the RF transmitter 10. The phase detector and gain circuit 36 includes individual PVT, acquisition and tracking gain circuits 52, 54 and 56 and a phase detection circuit 60. The phase error (PHE) output of the phase detector is received by the gain circuits 52–56 (each gain circuit uses an individual set of bits of PHE). The gain circuits 52–56 multiply the respective portions of PHE by an associated factor, GAIN_P, GAIN_A and GAIN_T. The outputs of the gain circuits, TUNE_P, TUNE_A and TUNE_T are the oscillator tuning words that control the oscillator control circuits 24, 26 28 and 30. As described in greater detail above, the oscillator control circuits sequentially control the DCO 12 through start-up, acquisition and tracking phases.

Figure 12B:
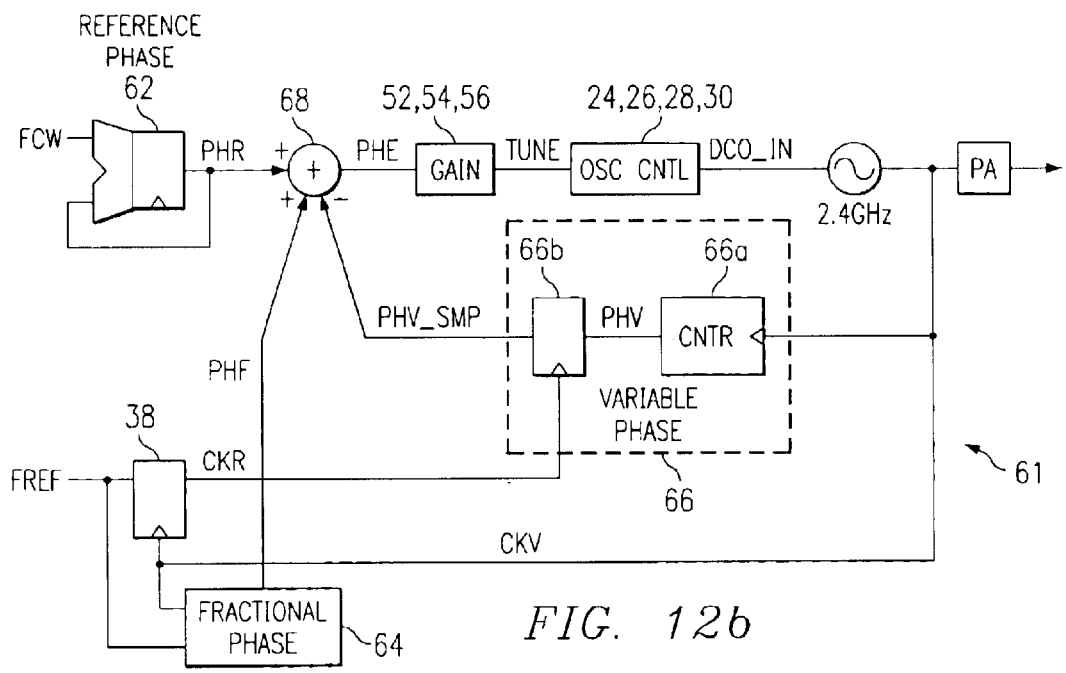
FIG. 12b illustrates a block diagram of a phase detection circuit in a generalized block diagram of a frequency synthesizer.

FIG. 12b illustrates the phase detection circuit 60 in a frequency synthesizer circuit 61. The phase detection circuit 60 includes a reference phase accumulator 62 that calculates a reference phase signal (PHR), a fractional error correction circuit 64 that calculates a fractional error correction (PHF), and a variable phase accumulator 66 that calculates a variable phase correction (PHV_SMP, which is integer only). The phase error (PHE) is calculated by phase detector 68 as PHE=PHR+PHFPHV−SMP (with proper bit alignment to line up integer and fractional portions).

FCW (frequency control word) is the ratio of the desired frequency of CKV divided by the frequency of FREF. FREF is typically the output of a crystal oscillator. The reference phase signal is an accumulation of FCW at the active edge of CKR, which is the retimed FREF clock. The FCW input to the reference accumulator 62 is used to establish the operating reference phase of the desired channel plus the modulation data.

The variable phase accumulator 66 comprises a counter 66a, which increments on each active edge of CKV and a latch 66b that latches the output of the counter at CKR.

The fractional phase circuit 64 determines a difference between an active edge of FREF and the next active edge of CKV, normalized to as a fraction of a CKV clock cycle.

Figure 12C:
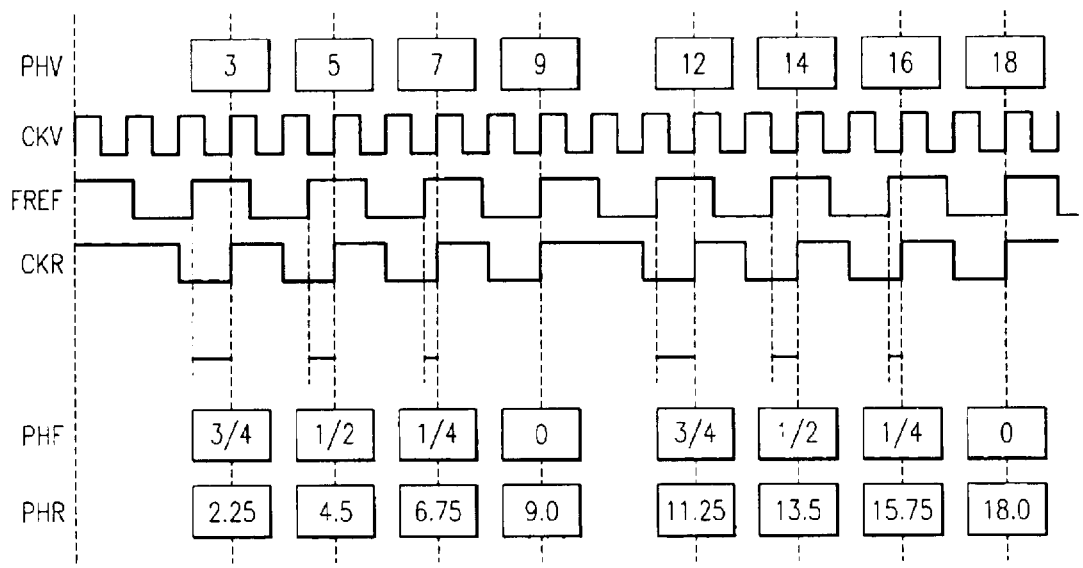
FIG. 12c illustrates a timing diagram showing signals from the frequency synthesizer of FIG. 12b.

Operation of the circuit is best understood in relation to the timing diagram of FIG. 12c, where an example of FCW=2.25 is used. In an actual circuit, however, FCW would typically be much higher. For purposes of illustration, FCW is a constant (i.e., no modulation) and there is no drift. As described above, the variable phase circuit 66 counts the CKV clocks and latches the count on the active (rising) edge of CKR. The PHV from the variable phase circuit 66 counts are provided above the CKV signal. Also at each active edge of CKR, the reference phase circuit 62 accumulates another FCW.

At any active edge of CKR, the preceding active edge of FREF may have occurred at a point less than one CKV clock cycle earlier (since CKR is retimed to CKV). This is shown by the dashed lines in FIG. 12c. PHF measures this fractional part of a CKV cycle. As can be seen in FIG. 12c, for the steady state situation, without drift or modulation, the addition of PHF and PHR will equal PHV and PHE will be zero.

During normal operation, however, the PHE will often be non-zero. As described above, the PVT oscillator controller 24, acquisition oscillator controller 26 and tracking controllers 28 and 30 operate one after another. The acquisition controller 26 starts after the oscillation controller 24 stops and the tracking controllers 28 and 30 operate after the acquisition controller 26 stops. At the point of a mode switch (from startup to acquisition or from acquisition to tracking), the value of the PHE change can be quite large. If the existing PHE is used immediately after a switch, a large perturbation can occur.

Figure 13:
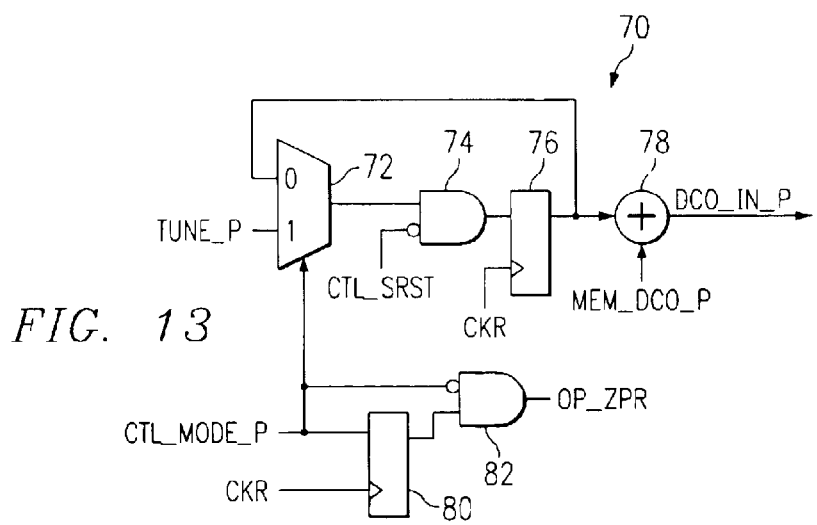
FIG. 13 illustrates a block diagram of a PVT oscillator interface and phase restart generation circuit.
Figure 14:
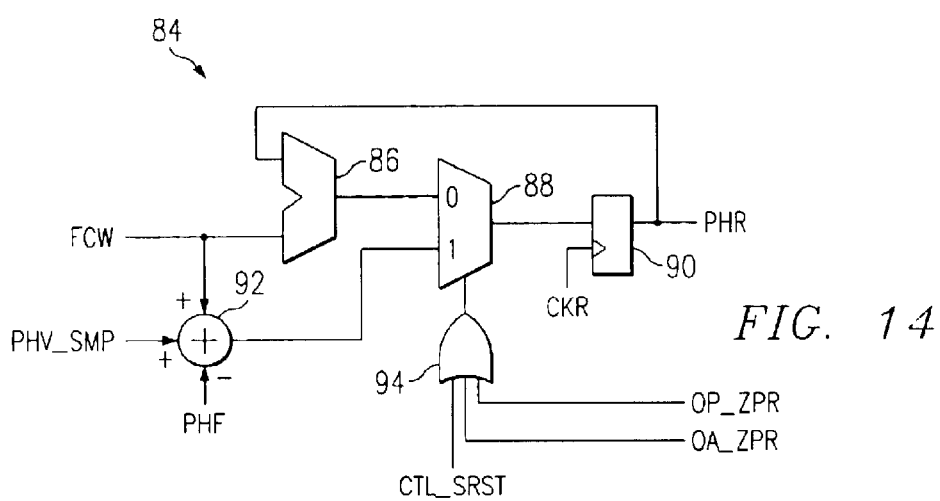
FIG. 14 illustrates a block diagram of a phase error restart correction circuit.

The circuits shown in FIGS. 13 and 14 restart the phase error at the correct value during a mode change. The circuit of FIG. 13 is a PVT-oscillator interface and phase restart generation circuit 70 in the PVT oscillator controller 24 that preserves the correct capacitor configuration in array 14a and sends a mode change signal when the PVT oscillator controller 24 has completed its function. In FIG. 13, CTL__MODE__P is high during the operation of the PVT oscillator controller 24. When CTL__MODE__P is high, TUNE__P is passed through multiplexer 72, AND gate 74, and flip-flop 76. TUNE__P is added to MEM__DCO__P (generally, the last frequency estimate from the controller's lookup table) by adder 78. The output, DCO__IN__P is used to enable/disable capacitors 18 in array 14a of the DCO. The synchronous reset CTL__SRST is used to set the digital logic and the capacitors to a predetermined configuration at startup.

When CTL__MODE__P transitions low, and the output of flip-flop 80 remains high, AND gate 82 outputs a pulse OP__ZPR, which indicates that the PVT oscillator controller 24 has just completed its task. Further, when CTL__MODE__P transitions low, multiplexer 72 passes the output of flip-flop 76; hence DCO__IN__P remains static.

A circuit essentially identical to the PVT-oscillator interface and phase restart circuit 70 is also provided in the acquisition oscillator controller 26 to indicate the end of the acquisition mode and to maintain the capacitors 18 of array 14b in their final state. The acquisition oscillator interface and phase restart generation circuit for the acquisition oscillator controller 26 outputs a signal OA__ZPR when the acquisition mode is finished.

FIG. 14 illustrates a block diagram of phase error restart circuit 84, which can be part of the reference accumulator 62. Under normal operation, FCW (frequency control word) is accumulated by adder 86. On each CKR clock, the accumulated FCW passes through multiplexer 88 and is stored in register 90. The output of register 90 is returned to adder 86, which adds the accumulated FCW with the new FCW. The output is the phase reference (PHR), shown in FIGS. 12b and 12c. However, upon startup (CTL__SRST is high), or end of a mode (OP__ZPR is high at the end of the PVT mode or OA__ZPR is high at the end of the acquisition mode), the output of OR gate 94 controls multiplexer 88 to pass a value equal to FCW+PHV__SMP−PHF (with proper bit alignment). This value will be the new PHR at the end of the PVT mode, the end of the acquisition mode or at startup.

Referring again to FIGS. 12b and 12c, it can be seen that the output value of the phase detection circuit 60 is PHE=PHR+PHF−PHV__SMP (with proper bit alignment). Substituting the re-calculated end-of-mode value for PHR, PHE=FCW+PHV__SMP−PHF+PHF−PHV__MP=FCW. Hence, PHE at the beginning of a new mode will be set to FCW or as close to zero as possible.

Figure 15:
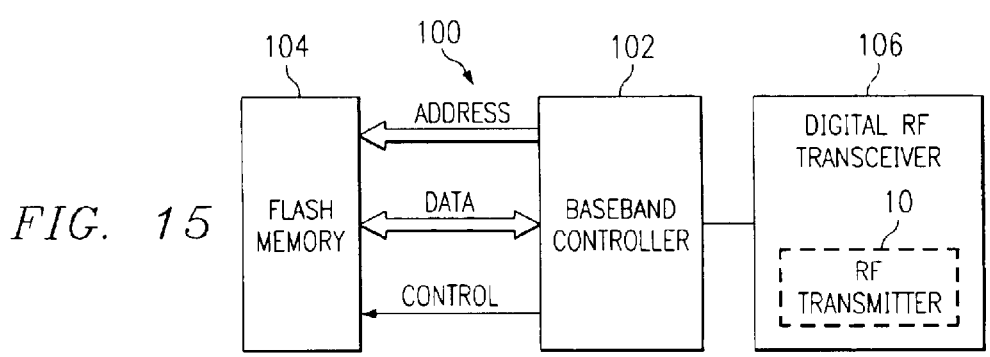
FIG. 15 illustrates a block diagram of a mobile communication device using the RF transmitter of FIG. 1.

FIG. 15 illustrates a preferred embodiment of a telecommunication device 100 using the frequency synthesizer 10. A baseband controller 102 is coupled to a memory 104 and a digital RF transceiver 106, which includes the RF transmitter 10 described above. The RF transmitter 10 may include any combination of the improvements described in detail above to improve the quality of the output.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. The frequency synthesizer, comprising:
a digitally controlled oscillator, including a plurality of switched capacitors;
control circuitry for selectively enabling and disabling said capacitors responsive to an oscillator tuning word, comprising:
select circuitry for enabling a number of capacitors responsive to said oscillator tuning word;
circuitry for dynamically varying which capacitors are enabled for a given oscillator tuning word to reduce non-linearities caused by slight variances in capacitive values; and a switch matrix coupled to said select circuitry, said dynamically varying circuitry and said plurality of switched capacitors, said switch matrix having a plurality of switches selectively enabled by said select circuitry and said dynamically varying circuitry, said switches for enabling or disabling respective switched capacitors.

2. The frequency synthesizer of claim 1 and further comprising drivers coupled between said switches and respective capacitors.

3. The frequency synthesizer of claim 2 wherein said drivers comprise resampling drivers.

4. The frequency synthesizer of claim 1 wherein said switches are arranged in a plurality of predefined groups.

5. The frequency synthesizer of claim 4 wherein said dynamically varying circuitry varies a set of switches enabled in a group.

6. The frequency synthesizer of claim 5 wherein said dynamically varying circuitry rotates said set of switches within a group.

7. The frequency synthesizer of claim 4 wherein said dynamically varying circuitry varies a set of switches enabled in a plurality of groups.

8. The frequency synthesizer of claim 7 wherein said dynamically varying circuitry rotates said set of switches within a plurality of groups.

9. A method of synthesizing a frequency, comprising the steps of:
selectively enabling and disabling capacitors in a digitally controlled oscillator responsive to an oscillator tuning word;
circuitry for dynamically varying which capacitors are enabled for a given error signal value to reduce non-linearities caused by slight variances in capacitive values; and
wherein said selectively enabling step comprises the step of selectively enabling and disabling switches in a switch matrix responsive to said oscillator tuning word and said dynamically varying step comprises the step of dynamically varying which switches are enabled for a given error signal value.

10. The method of claim 9 wherein said switches are arranged in a plurality of groups.

11. The method of claim 10 wherein said dynamically varying step comprises the step of dynamically varying a set of switches enabled in a group.

12. The method of claim 11 wherein said dynamically varying step comprises the step of rotating said set of switches within a group.

13. The method of claim 10 wherein said dynamically varying step varies a set of switches enabled in a plurality of groups.

14. The method of claim 13 wherein said dynamically varying step rotates said set of switches within said plurality of groups.

15. A frequency synthesizer comprising:
a digitally controlled oscillator, including a plurality of switched capacitors; and
control circuitry for selectively enabling and disabling said capacitors, comprising:
circuitry for tuning said digitally controlled oscillator to a selected frequency by enabling and disabling capacitors in a first set; and
circuitry for modulating said digitally controlled oscillator by enabling and disabling capacitors in a second set.

16. The frequency synthesizer of claim 15 wherein said tuning circuitry comprises circuitry for initially enabling and disabling said capacitors in said first set responsive to a oscillator tuning word while leaving said second set of capacitors in a predetermined state.

17. The frequency synthesizer of claim 15 wherein said tuning circuitry comprises circuitry for enabling and disabling said capacitors in said first set and said second set responsive to a oscillator tuning word and, after obtaining said selected frequency, rearranging the enabled and disabled capacitors such that the second set of capacitors is in a predetermined state.

18. A method of synthesizing a frequency, comprising the steps of:
tuning a digitally controlled oscillator by enabling and disabling a first set of switched capacitors to reach a selected frequency; and
modulating said digitally controlled oscillator by enabling and disabling a second set of switched capacitors.

19. The method of claim 18 wherein said tuning step comprises the step of initially enabling and disabling said capacitors in said first set responsive to a oscillator tuning word while leaving said second set of capacitors in a predetermined state.

20. The method of claim 18 wherein said tuning step comprises the step of enabling and disabling said capacitors in said first set and said second set responsive to a oscillator tuning word and, after obtaining said selected frequency, rearranging the enabled and disabled capacitors such that the second set of capacitors is in a predetermined state.

21. A frequency synthesizer comprising:
a digitally controlled oscillator, including a first set of switched capacitors and a second set of switched capacitors, where said second set of switched capacitors are in a physically separate area from said first set of switched capacitors;
control circuitry for selectively enabling and disabling said capacitors responsive to an oscillator tuning word, comprising:
first tracking circuitry for enabling and disabling capacitors responsive to an first portion of said oscillator tuning word and a first clock;
second tracking circuitry for enabling and disabling capacitors responsive to a second portion of said oscillator tuning word and a second clock, wherein said second clock is significantly faster than said first clock.

22. The frequency synthesizer of claim 21, wherein said second tracking circuitry includes a digital dithering circuit.

23. The frequency synthesizer of claim 22, wherein said digital dithering circuit comprises a sigma-delta modulation circuit.

24. The frequency synthesizer of claim 21, wherein said first tracking circuitry enables and disables capacitors in said first set responsive to an integer portion of said oscillator tuning word and said second tracking circuitry enables and disables capacitors in said second set responsive to an fractional portion of said oscillator tuning word.

25. A method of synthesizing a frequency comprising the steps of:
enabling and disabling a first set of switched capacitors in a digitally controlled oscillator responsive to an first portion of an oscillator tuning word and a first clock;
enabling and disabling a second set of switched capacitors, physically separate from said first set, in the digitally controlled oscillator responsive to a second portion of an oscillator tuning word and a second clock, wherein said second clock is significantly faster than said first clock.

26. The method of claim 25, wherein said step of enabling and disabling said second set of capacitors comprises the step of modulating said second set with a digital dithering circuit.

27. The method of claim 26 wherein said modulating step comprises the step of modulating the second set using sigma-delta modulation.

28. The method of claim 25, wherein said step of enabling and disabling said first set of capacitors comprises the step of enabling and disabling said first set of capacitors responsive to an integer portion of said oscillator tuning word and said step of enabling and disabling said second set of capacitors comprises the step of enabling and disabling said second set of capacitors responsive to an fractional portion of said oscillator tuning word.

* * * * *